United States Patent
Anuntapong et al.

(12) 
(10) Patent No.: US 6,560,729 B1
(45) Date of Patent: May 6, 2003

(54) AUTOMATED DETERMINATION AND DISPLAY OF THE PHYSICAL LOCATION OF A FAILED CELL IN AN ARRAY OF MEMORY CELLS

(75) Inventors: Suntra Anuntapong, Pattani (TH); Surasit Phurikhup, Bangkok (TH); Wannee Soiluck, Yasothorn (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 511 days.

(21) Appl. No.: 09/609,793

(22) Filed: Jul. 3, 2000

(51) Int. Cl.$^7$ .............................. G11C 29/00; G06K 9/00
(52) U.S. Cl. .......................... 714/718; 714/42; 714/57; 714/723; 382/145; 382/147; 382/149; 324/751
(58) Field of Search ............................. 714/42, 45, 46, 714/57, 718, 723, 733, 735, 738; 365/200, 201, 203, 189.02, 189.11; 324/751, 765; 382/145, 147, 149

(56) References Cited

U.S. PATENT DOCUMENTS

| | | | |
|---|---|---|---|
| 4,876,685 A | | 10/1989 | Rich .......................... 714/723 |
| 5,720,031 A | | 2/1998 | Lindsay ....................... 714/42 |
| 5,943,437 A | * | 8/1999 | Sumie et al. ................ 382/149 |
| 5,946,250 A | | 8/1999 | Suzuki ......................... 365/201 |
| 6,169,694 B1 | * | 1/2001 | Nam et al. ................... 365/201 |
| 6,294,918 B1 | * | 9/2001 | Hung .......................... 324/751 |
| 6,367,042 B1 | * | 4/2002 | Phan et al. .................. 714/733 |

FOREIGN PATENT DOCUMENTS

DE 197 46 695 6/1998

* cited by examiner

Primary Examiner—Emmanuel L. Moise
(74) Attorney, Agent, or Firm—Monica H. Choi

(57) ABSTRACT

A computer system automatically determines and displays the physical location of a failed memory cell of an array of memory cells on magnified images of a memory IC (integrated circuit) die from label information of the failed memory cell generated by a test station. The label information includes any combination of a sector label, an I/O label, a column label, and a row label. The memory IC die is comprised of a plurality of sectors, and the sector label corresponds to the sector having the failed memory cell located therein. A sector is comprised of a plurality of I/O regions, and the I/O label specifies the I/O region having the failed memory cell located therein, within the sector having the sector label. An I/O region is comprised of a plurality of horizontal conductive structures and vertical conductive structures. The column label indicates the vertical conductive structure coupled to the failed memory cell, and the row label indicates the horizontal conductive structure coupled to the failed memory cell, within the I/O region having the I/O label. The computer system accepts the label information and automatically determines and displays any combination of a first magnified image of the memory IC die with the sector corresponding to the sector label highlighted and/or a second magnified image of the sector corresponding to the sector label with the I/O region corresponding to the I/O label highlighted and/or a third magnified image of the I/O region corresponding to the I/O label with the vertical conductive structure corresponding to the column label and/or the horizontal conductive structure corresponding to the row label highlighted, on a GUI (graphical user interface) of the computer system.

27 Claims, 6 Drawing Sheets

Please enter the sector label: __

Please enter the I/O label: __

Please enter the column label: __

Please enter the row label: __

AUTOMATED DETERMINATION AND DISPLAY OF THE PHYSICAL LOCATION OF A FAILED CELL IN AN ARRAY OF MEMORY CELLS

TECHNICAL FIELD

The present invention relates generally to testing of IC (integrated circuit) dies during manufacture of IC (integrated circuit) packages, and more particularly, to a method and system for automatically determining and displaying the physical location of a failed cell of an array of memory cells on magnified images of a memory IC (integrated circuit) die having the array of memory cells.

BACKGROUND OF THE INVENTION

Referring to FIG. 1, a memory IC (integrated circuit) die has a memory device fabricated therein such as a non-volatile flash memory device comprised of an array of flash memory cells 20, as known to one of ordinary skill in the art of electronics. In FIG. 1, a first flash memory cell 22 and a second flash memory cell 24 form a first row of flash memory cells, and a third flash memory cell 26 and a fourth flash memory cell 28 form a second row of flash memory cells. The first flash memory cell 22 and the third flash memory cell 26 form a first column of flash memory cells, and the second flash memory cell 24 and the fourth flash memory cell 28 form a second column of flash memory cells.

An array of memory cells for a typical non-volatile memory device has more numerous flash memory cells (such as millions of flash memory cells) with more numerous rows and columns of flash memory cells. However, four memory cells 22, 24, 26, and 28 in an array of two rows by two columns are illustrated in FIG. 1 for clarity of illustration.

Referring to FIG. 2, a cross sectional view 100 is shown of one of the flash memory cells 22, 24, 26, and 28. A flash memory cell is a floating gate MOS (metal oxide semiconductor) type of device for a non-volatile flash memory device, as known to one of ordinary skill in the art of electronics. The cross section 100 of a flash memory cell includes a control gate 102 which typically is comprised of polysilicon. A drain junction 104 that is doped with a junction dopant, such as arsenic (As) or phosphorous (P) for example, is formed within a semiconductor substrate 106. A source junction 108 that is doped with the junction dopant is formed within the semiconductor substrate 106.

A control dielectric structure is formed over a control gate area 110 within the semiconductor substrate 106 that is disposed between the drain junction 104 and the source junction 108. The control dielectric structure is comprised of a stack of a first dielectric layer 112 disposed on the semiconductor substrate 106, a second dielectric layer 114 disposed on the first dielectric layer 112, and a third dielectric layer 116 disposed on the second dielectric layer 114. In one example of the control dielectric structure, the first dielectric layer 112 is comprised of silicon dioxide ($SiO_2$), the second dielectric layer 114 is comprised of silicon nitride (SiN), and the third dielectric layer 116 is comprised of silicon dioxide ($SiO_2$). A first field oxide 118 is formed within the drain junction 104, and a second field oxide 120 is formed within the source junction 108 for electrically isolating the gate dielectric structure comprised of the first, second, and third dielectric layers 112, 114, and 116 and the control gate 102.

Referring to FIGS. 1 and 2, the drain junction of each of the memory cells in a column are coupled together to form a "bit-line", as known to one of ordinary skill in the art of electronics. In FIG. 1, the first column of memory cells 22 and 26 are coupled to a first bit-line 32, and the second column of memory cells 24 and 28 are coupled to a second bit-line 34, for example. The control gate of each of the memory cells in a row are coupled together to form a "word-line", as known to one of ordinary skill in the art of electronics. In FIG. 1, the first row of memory cells 22 and 24 are coupled to a first word-line 42, and the second row of memory cells 26 and 28 are coupled to a second word-line 44, for example.

Referring to FIG. 2, during a program operation or an erase operation of a cell of a flash memory device, charge carriers are injected into or injected out of the second dielectric layer 114. Such variation of the amount of charge carriers within the second dielectric layer 114 alters the threshold voltage of the control gate 102, as known to one of ordinary skill in the art of electronics. For example, when electrons are the charge carriers that are injected into the second dielectric layer 114, the threshold voltage increases. Alternatively, when electrons are the charge carriers that are injected out of the second dielectric layer 114, the threshold voltage decreases.

The charge carriers are injected into or injected out of the second dielectric layer 114 from the drain junction 104 to the control dielectric structure when bias voltages are applied on the control gate 102 via a control gate terminal 122 (i.e., the word-line coupled to the control gate 102), as known to one of ordinary skill in the art of electronics. For example, when a bias voltage of approximately +12V is applied on the control gate terminal 122 for programming the memory cell, electrons are injected into the second dielectric layer 114 from the drain junction 104 by hot carrier injection effect, as known to one of ordinary skill in the art of electronics. Alternatively, when a bias voltage of approximately −12V is applied on the control gate terminal 122 for erasing the memory cell, electrons are injected out of the second dielectric layer 114 and to the drain junction 104 by hot carrier injection effect, as known to one of ordinary skill in the art of electronics.

For reading digital bit information from a memory cell, a gate-to-source voltage of approximately 5.0V and a drain-to-source voltage of approximately 1.5V are applied to the memory cell. With such bias, the memory cell conducts current or does not conduct current depending on whether the memory cell has been programmed or erased. These two conditions are used as the two states for storing digital bit information within the flash memory cell 100, as known to one of ordinary skill in the art of electronics.

During manufacture of a non-volatile flash memory device, the memory IC die for the non-volatile flash memory device is tested for proper functionality. Systems for testing the functionality of the memory IC dies are known to one of ordinary skill in the art of IC package manufacture. Such a testing system outputs label information of a failed memory cell that does not function properly during such testing for indicating the physical location of such a failed memory cell on the memory IC die.

Label information for a memory IC die is devised during layout of the integrated circuit of the memory IC die, and such label information is recorded in a design book, as known to one of ordinary skill in the art of integrated circuit design. For example, referring to FIG. 3, an array of memory cells are fabricated in a memory IC die 202. The memory IC die 202 of FIG. 3 includes a plurality of contact pads 204, 206, 208, 210, 212, 214, 216, 218, 220, and 222 for providing connection to nodes of the flash memory integrated circuit fabricated on the IC die 202. A typical memory IC die includes more numerous contact pads, but ten contact pads 204, 206, 208, 210, 212, 214, 216, 218, 220, and 222 are illustrated in FIG. 3 for clarity of illustration.

Further referring to FIG. 3, the array of memory cells are divided into a plurality of sectors, including a first sector 232, a second sector 234, a third sector 236, and a fourth sector 238, on the memory IC die 202. A typical memory IC die includes more numerous sectors, but four sectors 232, 234, 236, and 238 are illustrated in FIG. 3 for clarity of illustration. The reason for designing the memory IC die 202 with a plurality of sectors is that during layout of the memory IC die 202, the layout for each sector may be stamped for easier layout of the memory IC die 202, as known to one of ordinary skill in the art of integrated circuit design. Thus, each of the sectors 232, 234, 236, and 238 on the memory IC die 202 have substantially identical layout.

Referring to FIGS. 3 and 4, each sector has a respective array of memory cells fabricated therein. Referring to FIG. 4, the first sector 232 for example includes a plurality of rows and a plurality of columns of memory cells. Referring to FIG. 1, the control gate of each memory cell in a row of memory cells is coupled to a word-line for that row. Referring to FIG. 4, a word-line for a row of memory cells is formed by a horizontal conductive structure including a first horizontal conductive structure 242, a second horizontal conductive structure 244, a third horizontal conductive structure 246, and a fourth horizontal conductive structure 248.

A horizontal conductive structure may be comprised of polysilicon for example when the horizontal conductive structure forms a word-line coupled to the control gate of each memory cell in a row of memory cells. A sector typically has more numerous horizontal conductive structures such as thousands of horizontal conductive structures for a higher number of rows of memory cells. However, four horizontal conductive structures 242, 244, 246, and 248 are shown in FIG. 4 for clarity of illustration.

Similarly, referring to FIG. 1, the drain of each memory cell in a column of memory cells is coupled to a bit-line for that column. An example vertical conductive structure 250 is referred to in FIG. 4 (but the other vertical conductive structures in FIG. 4 are not labeled with a number label for clarity of illustration). A vertical conductive structure typically is a metal line, as known to one of ordinary skill in the art of integrated circuit design.

A sector is typically comprised of a higher number of vertical conductive structures than illustrated in FIG. 4 (such as thousands of vertical conductive structures), but fewer vertical conductive structures are illustrated in FIG. 4 for clarity of illustration. The sector 232 is typically divided into a plurality of I/O regions including a first I/O region 262, a second I/O region 264, a third I/O region 266, and a fourth I/O region 268 (shown within dashed lines in FIG. 4). Each I/O region has a set pattern of vertical conductive structures therein. A typical sector 232 has more numerous I/O regions for more numerous vertical conductive structures in a sector, but four I/O regions 262, 264, 266, and 268 are illustrated in FIG. 4 for clarity of illustration. In addition, a typical I/O region has more numerous vertical conductive structures than illustrated in FIG. 4, but six vertical conductive structures are illustrated within each I/O region in FIG. 4 for clarity of illustration.

The reason for designing the sector 232 with a plurality of I/O regions is that during layout of the memory IC die 202, the layout for each I/O region may be stamped for easier layout of the memory IC die 202, as known to one of ordinary skill in the art of integrated circuit design. Thus, each of the I/O regions 262, 264, 266, and 268 have substantially identical layout. In addition, at least one vertical conductive structure is fabricated as a "redundancy region" between two adjacent I/O regions such that the adjacent I/O regions are visually distinct from each other. For example, in FIG. 4, a first vertical conductive structure 272 forms a first redundancy region disposed between the first I/O region 262 and the second I/O region 264, a second vertical conductive structure 274 forms a second redundancy region disposed between the second I/O region 264 and the third I/O region 266, and a third vertical conductive structure 276 forms a third redundancy region disposed between the third I/O region 266 and the fourth I/O region 268.

During testing of a memory IC die having an array of memory cells, a test station indicates the physical location of a failed memory cell by outputting a sector label, an I/O label, a row label, and a column label of the failed memory cell. Referring to FIG. 3, the sector label refers to one of the sectors 232, 234, 236, and 238 having the failed memory cell located therein. Referring to FIG. 4, the I/O label refers to one of the I/O regions 262, 264, 266 and 268 having the failed memory cell located therein within the sector corresponding to the sector label. The column label refers to one of the vertical conductive structures coupled to the drain of the failed memory cell within the I/O region corresponding to the I/O label. The row label indicates one of the horizontal conductive structures 242, 244, 246, and 248 coupled to the control gate of the failed memory cell.

When the test station determines the label information, including the sector label, the I/O label, the row label, and the column label of a failed memory cell, an operator locates the horizontal conductive structure and the vertical conductive structure coupled to such a failed memory cell to determine the physical location of the failed memory cell on the memory IC die. Further testing may be performed on the failed memory cell with determination of the location of the horizontal conductive structure and of the vertical conductive structure corresponding to the failed memory cell and of the physical location of the failed memory cell on the memory IC die to further determine the cause of failure of the memory cell. With determination of the cause of failure of the memory cell, corrective action may be undertaken to prevent the occurrence of failed memory cells during manufacture of memory IC dies.

In the prior art, when a test station outputs the label information of a sector label, an I/O label, a row label, and a column label of the failed memory cell, the operator studies the design book of how the memory IC die has been laid out to translate the label information to the physical location of the failed memory cell on the memory IC die. The operator views a magnified image of the memory IC die and counts the horizontal conductive structures and the vertical conductive structures to manually translate the label information of a sector label, an I/O label, a row label, and a column label of the failed memory cell to the physical location of the failed memory cell on the memory IC die.

Such a manual determination of the physical location of the failed memory cell requires the operator to count thousands of horizontal conductive structures and vertical conductive structures. As a result, manual determination of the physical location of the failed memory cell in the prior art is time consuming and is prone to human error.

Thus, a mechanism is desired for automatically determining and displaying the physical location of a failed memory cell of an array of memory cells on magnified images of a memory IC (integrated circuit) die.

SUMMARY OF THE INVENTION

Accordingly, in a general aspect of the present invention, a software application is used with a computer system for automatically determining and displaying the physical location of a failed memory cell of an array of memory cells on magnified images of a memory IC (integrated circuit) die from label information of the failed memory cell generated by a test station.

In a general aspect of the present invention, a data processor of the computer system accepts a memory IC (integrated circuit) die name corresponding to the memory IC die. The data processor also accepts a sector label. The memory IC die is comprised of a plurality of sectors, and the failed cell is located within a sector corresponding to the sector label. The data processor retrieves a first magnified image of the memory IC die corresponding to the memory IC die name from a data storage unit. The data processor maps the sector label to a sector corresponding to the sector label on the first magnified image of the memory IC die and may display the first magnified image of the memory IC die with the sector corresponding to the sector label highlighted on a GUI (graphical user interface).

In another embodiment of the present invention, the data processor accepts an I/O (input/output) label. The sector corresponding to the sector label is comprised of a plurality of I/O (input/output) regions, and the failed cell is located within an I/O region corresponding to the I/O label. The data processor retrieves a second magnified image of the sector corresponding to the sector label from the data storage unit. The data processor maps the I/O label to an I/O region corresponding to the I/O label on the second magnified image of the sector corresponding to the sector label, and displays the second magnified image of the sector corresponding to the sector label with the I/O region corresponding to the I/O label highlighted, on the GUI (graphical user interface).

In a further embodiment of the present invention, the data processor accepts a column label. The I/O region corresponding to the I/O label is comprised of a plurality of columns of memory cells. Each column of memory cells has a vertical conductive structure coupled to a node of each of the plurality of memory cells in the column, and the failed cell is located within a column of memory cells corresponding to the column label. The data processor retrieves a third magnified image of the I/O region corresponding to the I/O label from the data storage unit. The data processor maps the column label to a vertical conductive structure corresponding to the column label on the third magnified image of the I/O region corresponding to the I/O label and displays the third magnified image of the I/O region corresponding to the I/O label with the vertical conductive structure corresponding to the column label highlighted, on the GUI (graphical user interface).

In another embodiment of the present invention, the data processor accepts a row label. The I/O region corresponding to the I/O label is comprised of a plurality of rows of memory cells, and each row of memory cells has a horizontal conductive structure coupled to a node of each of the plurality of memory cells in the row. The failed cell is located within a row of memory cells corresponding to the row label. The data processor retrieves the third magnified image of the I/O region corresponding to the I/O label from the data storage unit. The data processor maps the row label to a horizontal conductive structure corresponding to the row label on the third magnified image of the I/O region corresponding to the I/O label and displays the third magnified image of the I/O region corresponding to the I/O label with the horizontal conductive structure corresponding to the row label highlighted, on the GUI (graphical user interface).

The present invention may be used to particular advantage when the memory IC die is a non-volatile flash memory device comprised of an array of floating gate MOS (metal oxide semiconductor) memory cells. In that case, the horizontal conductive structure may be a polysilicon line that is coupled to a control gate of each of a row of floating gate MOS memory cells, and the vertical conductive structure may be a metal line that is coupled to a drain of each of a column of floating gate MOS memory cells.

In this manner, the physical location of the horizontal conductive structure and of the vertical conductive structure and of the failed memory cell on magnified images of the memory IC die is automatically determined and displayed on the GUI (graphical user interface) from the label information of the failed memory cell within a relatively short period of time (such as a fraction of a minute, for example). Thus, an operator is saved from the time-consuming labor of counting thousands of conductive structures of the prior art manual determination process. In addition, the present invention avoids the human error of the prior art manual determination process.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, and 11 refer to elements having similar structure and function.

DETAILED DESCRIPTION

Figure 5:
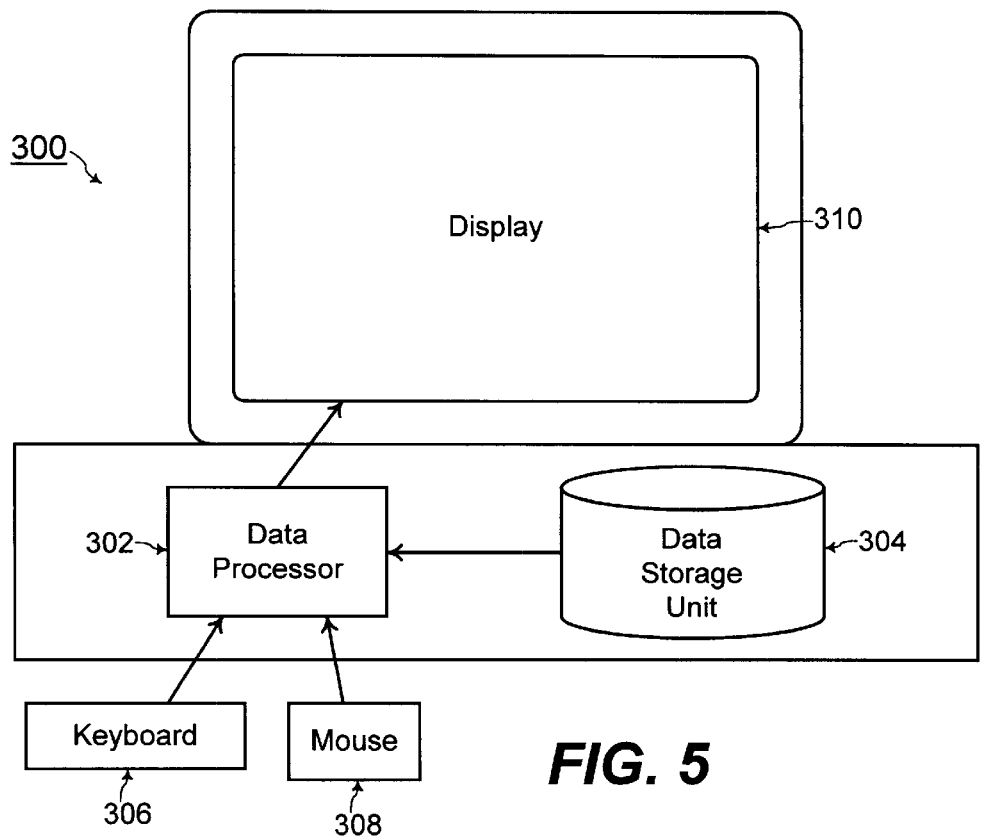
FIG. 5 shows components of a computer system for executing the sequences of the software application for automatically determining and displaying the physical location of a failed memory cell of an array of memory cells on magnified images of a memory IC (integrated circuit) die from label information generated by a test station, according to an embodiment of the present invention.

Referring to FIG. 5, a block diagram of an example computer system 300 includes a data processor 302 and a data storage unit 304. The data storage unit 304 may include a static storage device of the computer system 200 such a ROM (Read Only Memory) device, a main memory of the computer system 300 such as a RAM (Random Access Memory) device, and/or any other type of data storage device such as a floppy disk or a compact disc, as known to one of ordinary skill in the art of electronics. The data storage unit 304 stores data and instructions to be executed by the data processor 302, and may also store temporary variables during execution of instructions by the data processor 302, as known to one of ordinary skill in the art of electronics.

The computer system 300 also includes external data input devices such as a keyboard 306 and a mouse 308 which are known to one of ordinary skill in the art of electronics. In addition, the computer system 300 also includes a display 310 such as a GUI (graphical user interface) screen as known to one of ordinary skill in the art of electronics.

In a general aspect of the present invention, the computer system 300 is used for automatically determining and displaying the physical location of a failed memory cell of an array of memory cells on magnified images of a memory IC (integrated circuit) die from label information of the failed memory cell generated by a test station. The data processor 302 of the computer system 300 executes sequences of instructions contained in the data storage unit 304. Such instructions may be programmed into the main memory of the computer system 300 or may be written into the main memory of the computer system 300 from another computer-readable medium such as a floppy disk or a compact disc. Execution of such sequences of instructions causes the data processor 302 to perform the steps of an embodiment of the present invention as described herein.

Figure 6:
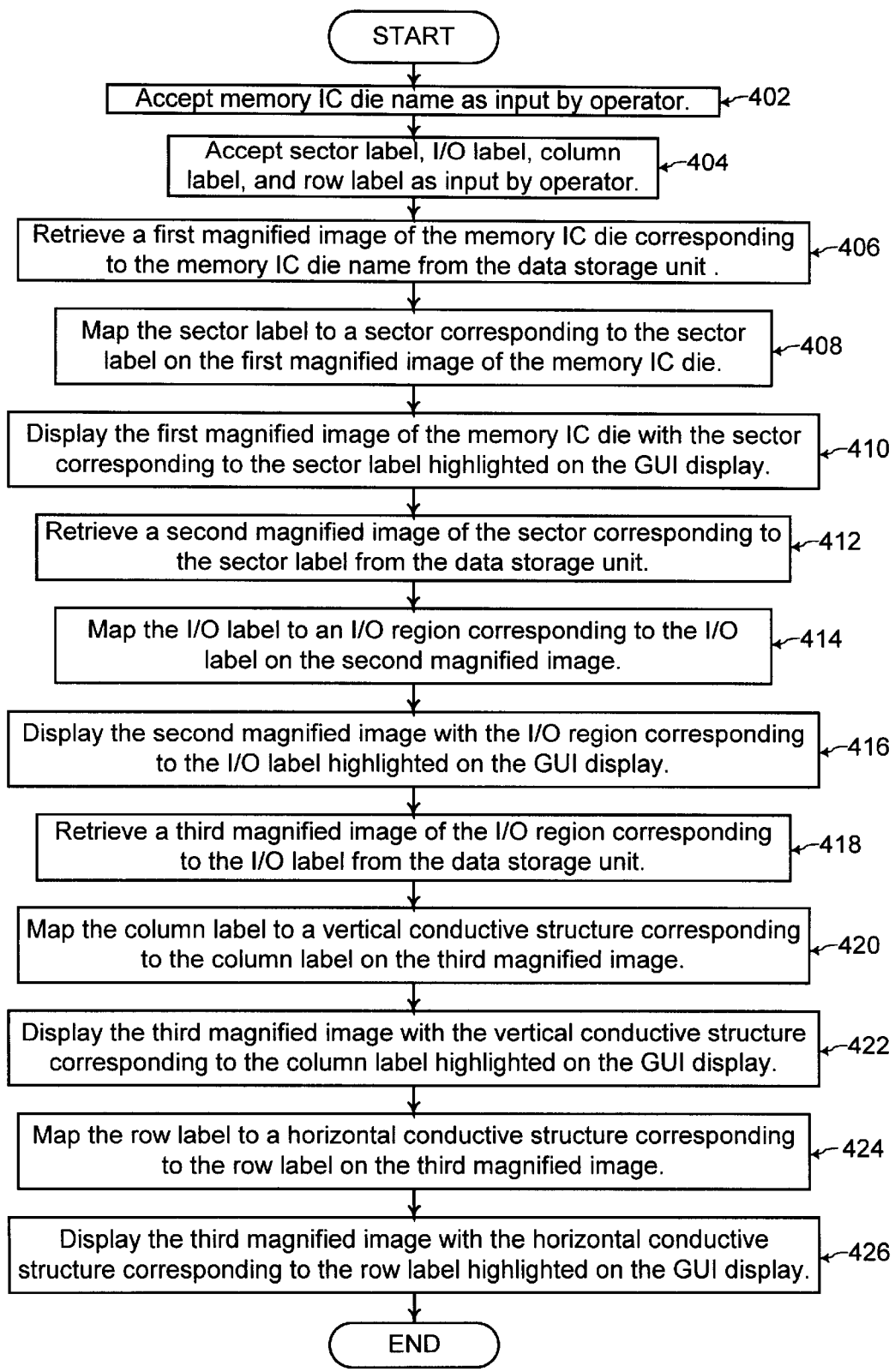
FIG. 6 shows a flowchart for illustrating the steps of operation of the software application for automatically determining and displaying the physical location of a failed memory cell of an array of memory cells on magnified images of a memory IC (integrated circuit) die from label information generated by a test station, according to one embodiment of the present invention.

FIG. 6 shows a flowchart including the general steps of an embodiment of the present invention for automatically determining and displaying the physical location of a failed memory cell of an array of memory cells on magnified images of a memory IC (integrated circuit) die from label information of the failed memory cell generated by a test station.

Many types of memory IC dies are manufactured for providing a variety of memory capacity. The various types of memory IC dies have different layouts. For example, a non-volatile memory IC die that provides for higher memory capacity would have a larger die size with a higher number of sectors with each sector being larger. Referring to FIGS. 5 and 6, the operation of an embodiment of the present invention includes a step of accepting by the data processor 302 a memory IC die name of the memory IC die having the failed memory cell to be located (step 402 in FIG. 6).

Figure 7:
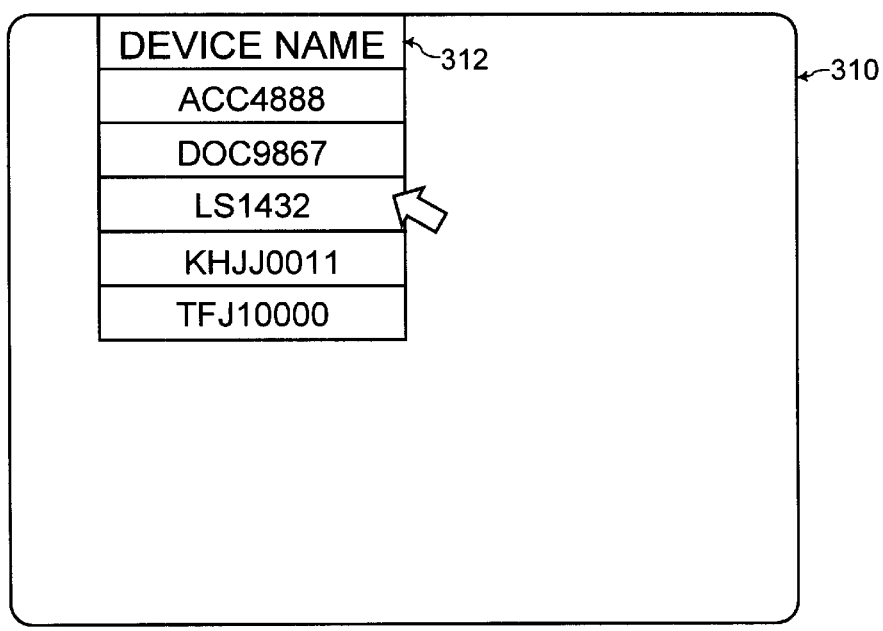
FIG. 7 illustrates the use of a pull-down menu for inputting by the operator the memory IC die name on a GUI (graphical user interface), according to one embodiment of the present invention.

Referring to FIG. 7, the data processor 302 may provide a pull-down menu 312 on the GUI (graphical user interface) screen 310 with display of the possible memory IC die names. An operator, using the keyboard 306 or the mouse 308, selects a memory IC die name from the pull-down menu 312. For the example of the pull-down menu 312 of FIG. 7, the possible memory IC die names are "ACC4888", "DOC9867", "LS1432", "KHJJ0011", and "TFJ10000". Programming applications, such as the Authorware Professional Macromedia Program from Macromedia, Inc. located in San Francisco, Calif., for creating the pull-down menu 312 are known and commercially available to one of ordinary skill in the art of software programming.

Figures 8, 9:
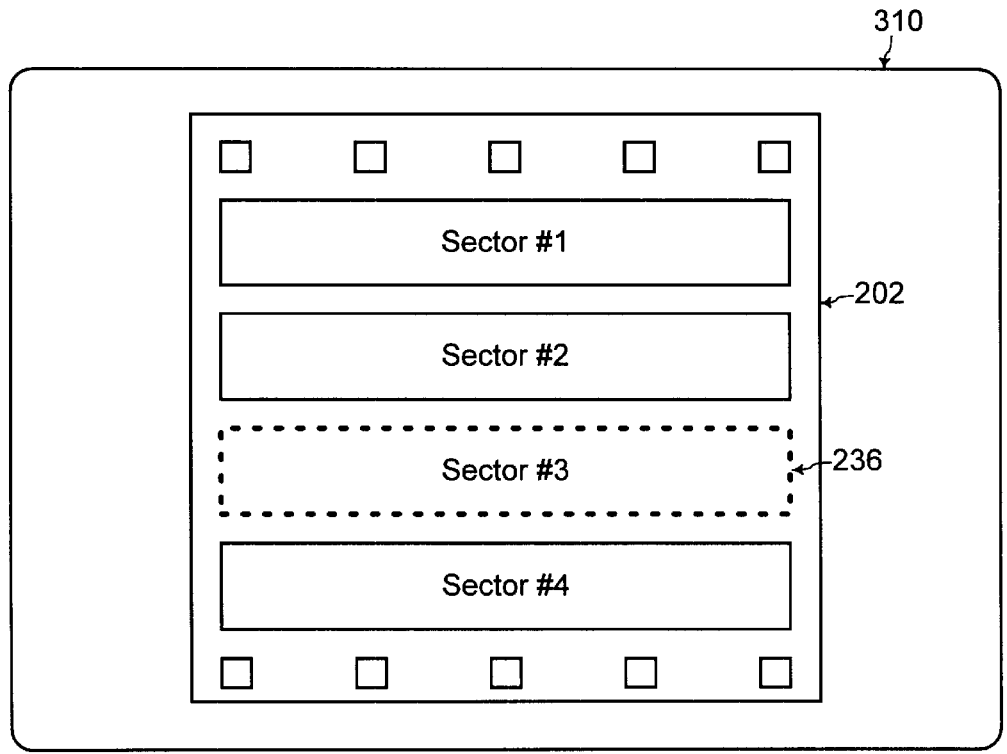
FIG. 8 illustrates the inputting by the operator of the label information including the sector label, the I/O label, the row label, and the column label of the failed memory cell on the GUI (graphical user interface), according to one embodiment of the present invention.
FIG. 9 illustrates the display of the magnified image of the memory IC die with the sector corresponding to the sector label highlighted on the GUI (graphical user interface), according to one embodiment of the present invention.

Referring to FIG. 6, the label information of the failed memory cell is accepted by the data processor 302 (step 404 of FIG. 6). As described herein with reference to FIGS. 3 and 4, the label information may include the sector label, the I/O label, the column label, and the row label of the failed memory cell in an array of memory cells. Referring to FIG. 8, the operator may input such label information on the GUI (graphical user interface) screen 310 using the keyboard 306 according to one embodiment of the present invention. In another embodiment of the present invention, the test station that generates such label information of the failed memory cell may send such label information to the data processor 302.

Referring to FIG. 6, the data processor 302 then retrieves a first magnified image of the memory IC die corresponding to the memory IC die name from the data storage unit 304 (step 406 of FIG. 6). Systems for generating magnified images of a memory IC die for various magnification factors and for various locations of the memory IC die are known to one of ordinary skill in the art of IC package manufacture. In addition, mechanisms for storing such magnified images of a memory IC die in the data storage unit 304 of the computer system 300 are known to one of ordinary skill in the art of electronics. Magnified images of various memory IC dies are generated and stored within the data storage unit 304.

Referring to FIG. 6, the data processor 302 then maps the sector label to the sector corresponding to the sector label on the first magnified image of the memory IC die (step 408 of FIG. 6). Programming applications, such as the Authorware Professional Macromedia Program from Macromedia, Inc. located in San Francisco, Calif., for mapping information to an area on a graphical image are known and commercially available to one of ordinary skill in the art of software programming. Such a programming application is used to program the mapping of the sector label to the sector corresponding to the sector label on the first magnified image of the memory IC die.

Figure 1:
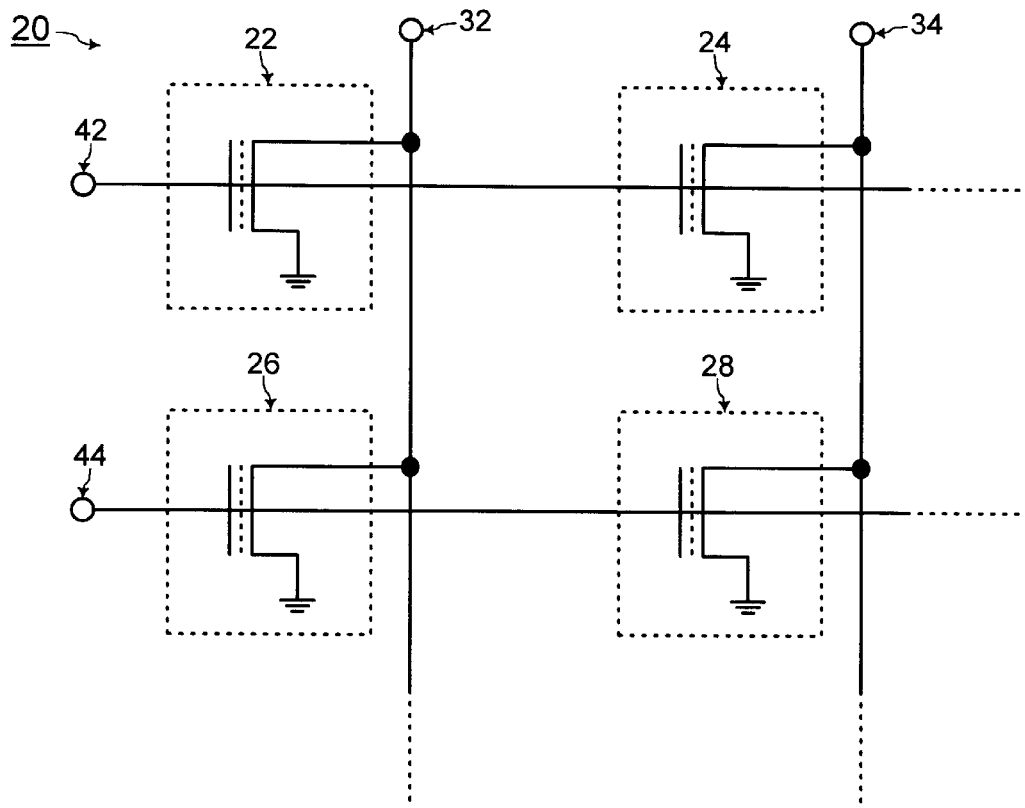
FIG. 1 shows an array of memory cells of an example non-volatile memory device.
Figure 2:
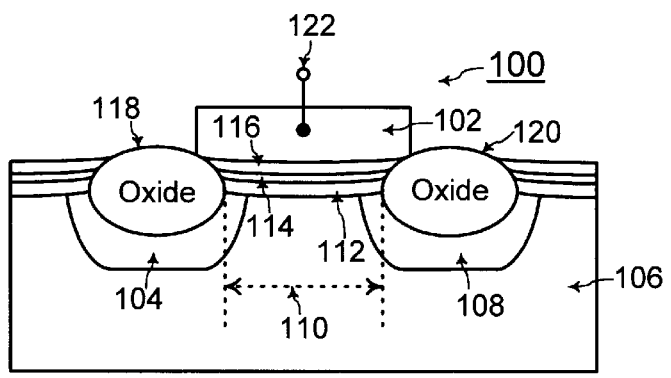
FIG. 2 shows a cross-sectional view of one of the memory cells of FIG. 1 fabricated within a semiconductor substrate.
Figure 3:
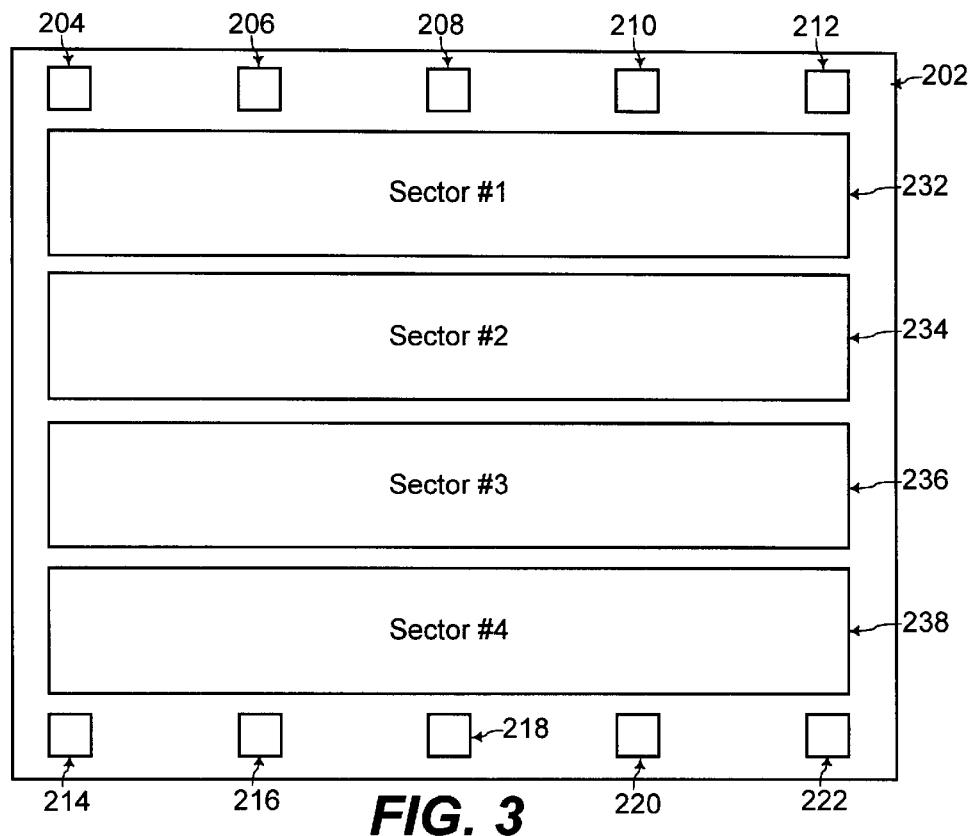
FIG. 3 shows an example layout of a memory IC (integrated circuit) die having a plurality of sectors.

Referring to FIG. 9, the data processor 302 displays the first magnified image of the memory IC die on the GUI (graphical user interface) screen 310 with the sector corresponding to the sector label highlighted (step 410 of FIG. 6). In FIG. 9, for the example memory IC die 202 of FIG. 3, assume that the sector label is "3" corresponding to the third sector 236. In that case, a magnified image of the IC memory die 202 of FIG. 3 is displayed on the GUI (graphical user interface) screen 310 with the third sector 236 highlighted.

Referring to FIG. 6, the data processor 302 then retrieves a second magnified image of the sector corresponding to the sector label from the data storage unit 304 (step 412 of FIG. 6). The second magnified image is a graphical image of the sector corresponding to the sector label with a higher magnification factor than the first magnified image of the whole memory IC die.

The data processor then maps the I/O label to an I/O region corresponding to the I/O label on the second magnified image of the sector corresponding to the sector label (step 414 of FIG. 6). Programming applications, such as the Authorware Professional Macromedia Program from Macromedia, Inc. located in San Francisco Calif., for mapping information to an area on a graphical image are known and commercially available to one of ordinary skill in the art of software programming. Such a programming application is used to program the mapping of the I/O label to an I/O region corresponding to the I/O label on the second magnified image of the sector corresponding to the sector label.

Figure 4:
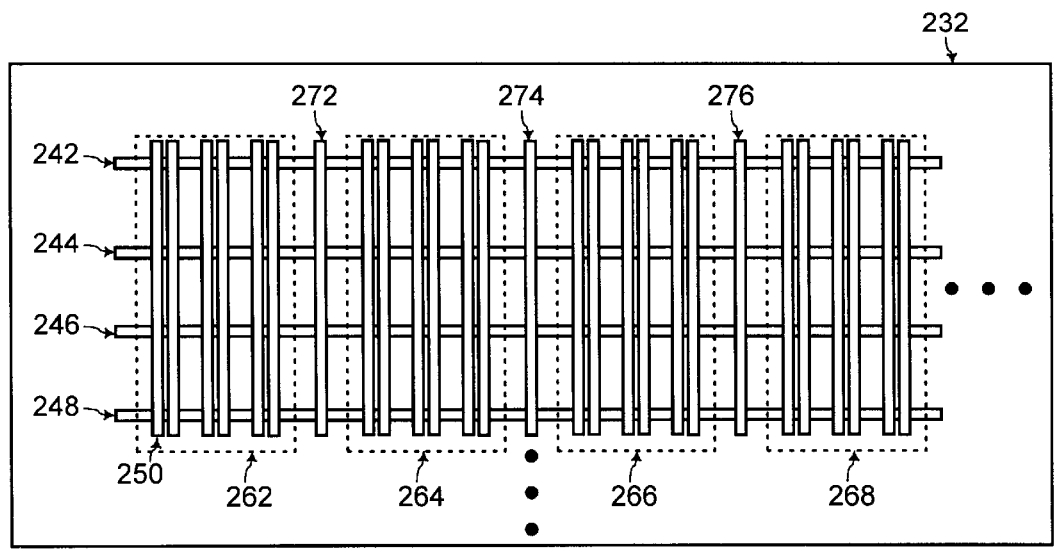
FIG. 4 shows an example sector of FIG. 3 having a plurality of I/O regions, with each I/O region having a plurality of horizontal conductive structures and a plurality of vertical conductive structures.
Figure 10:
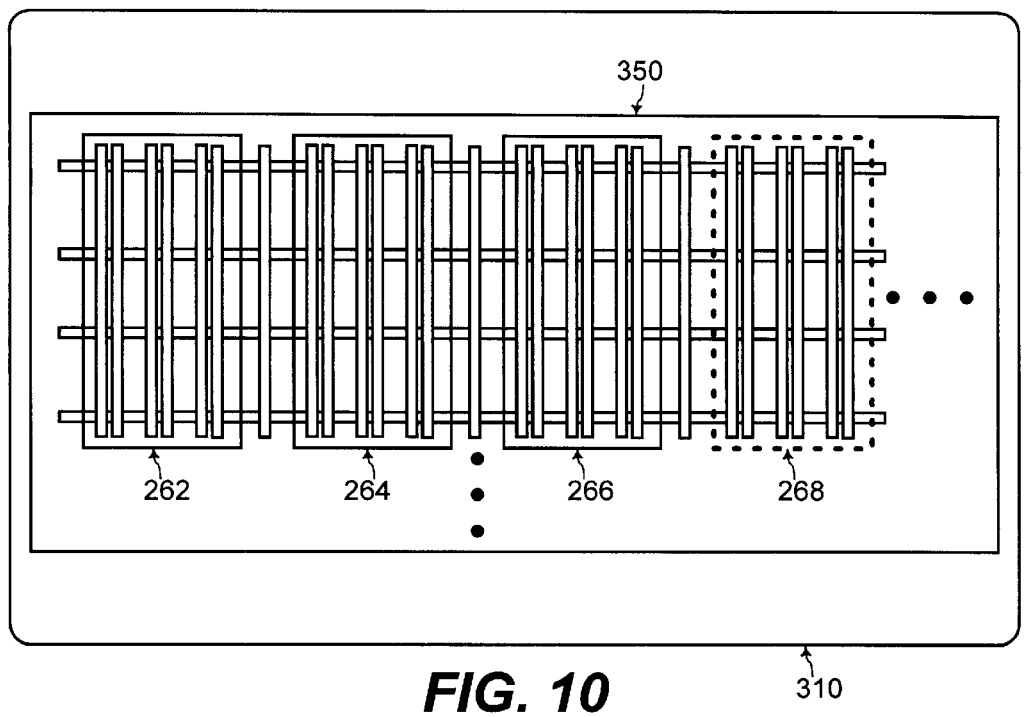
FIG. 10 illustrates the display of the magnified image of the sector corresponding to the sector label with the I/O region corresponding to the I/O label highlighted on the GUI (graphical user interface), according to an embodiment of the present invention.

As described herein with reference to FIG. 4, a sector is comprised of a plurality of I/O regions. The I/O label corresponds to the I/O region having the failed memory cell located therein. Referring to FIG. 10, the data process or 302 displays the second magnified image 350 of the sector corresponding to the sector label on the GUI (graphical user interface) screen 310 with the I/O region corresponding to the I/O label highlighted (step 416 of FIG. 6). In FIG. 10, for the example sector 232 of FIG. 4 assume that the I/O label is "4" corresponding to the fourth I/O region 268 w thin the sector 232. In that case, a magnified image of the sector 232 of FIG. 4 is displayed on the GUI (graphical user interface) screen 310 with the fourth I/O region 268 highlighted.

Referring to FIG. 6, the data processor 302 then retrieves a third magnified image of the I/O region corresponding to the I/O label from the data storage unit 304 (step 418 of FIG. 6). The third magnified image is a graphical image of the I/O region corresponding to the I/O label with a higher magnification factor than the second magnified image of the sector corresponding to the sector label.

The data processor 302 then maps the column label to a vertical conductive structure corresponding to the column label on the third magnified image of the I/O region corresponding to the I/O label (step 420 of FIG. 6). Programming applications, such as the Authorware Professional Macromedia Program from Macromedia, Inc. located in San Francisco Calif., for mapping information to an area on a graphical image are known and commercially available to one of ordinary skill in the art of software programming. Such a programming application is used to program the mapping of the column label to a vertical conductive structure corresponding to the column label on the third magnified image of the I/O region corresponding to the I/O label.

As described herein with reference to FIG. 4, an I/O region is comprised of a plurality of vertical conductive structures with each vertical conductive structure coupled to the drain of a column of MOS (metal oxide semiconductor) type of flash memory cells. The column label corresponds to the vertical conductive structure coupled to the column of flash memory cells having the failed memory cell.

Figure 11:
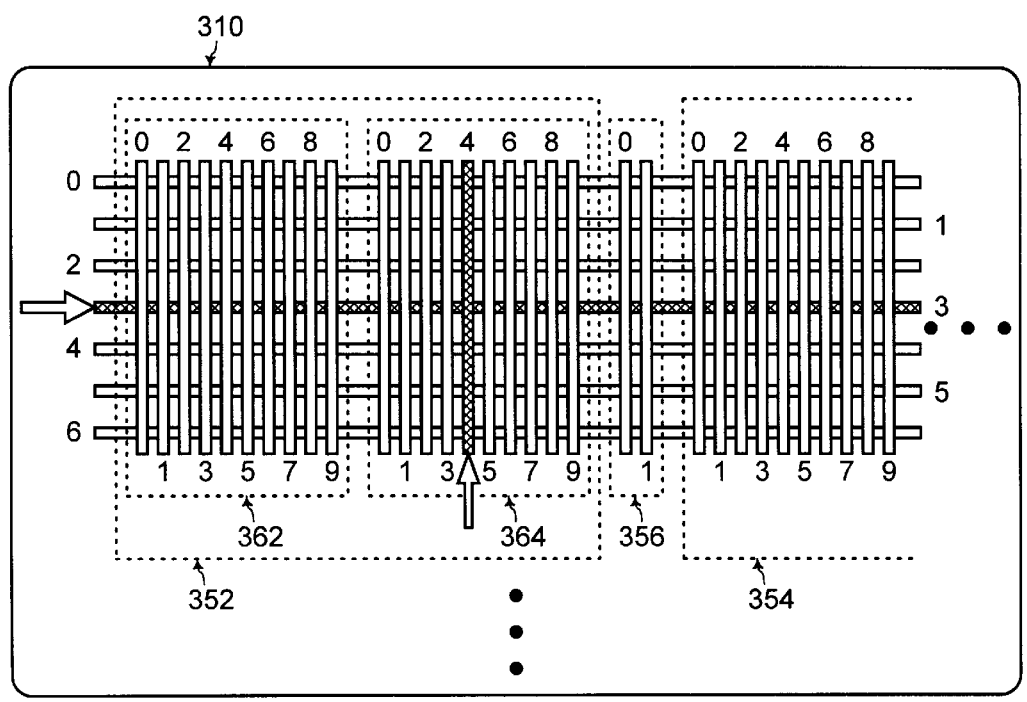
FIG. 11 illustrates the display of the magnified image of the I/O region corresponding to the I/O label with the horizontal conductive structure corresponding to the row label highlighted and with the vertical conductive structure corresponding to the column label highlighted on the GUI (graphical user interface), according to an embodiment of the present invention.

Referring to FIG. 11, the data processor 302 displays the third magnified image of the I/O region corresponding to the I/O label on the GUI (graphical user interface) screen 310 with the vertical conductive structure corresponding to the column label highlighted (step 422 of FIG. 6). In FIG. 11, for example, a left I/O region 352 is separated from a right I/O region 354 by a redundancy region 356 (with the regions 352, 354, and 356 being within dashed lines in FIG. 11). The left I/O region 352 is the I/O region corresponding to the I/O label having the failed memory cell located therein, and the third magnified image of this I/O region 352 is displayed on the GUI (graphical user interface) screen 310. A redundancy region is formed between two adjacent I/O regions such that the adjacent I/O regions are visually distinct from each other in the magnified image of the I/O regions.

Referring to FIG. 11, each I/O region has a group of vertical conductive structures with further spacing between two adjacent groups of vertical conductive structures such that the adjacent groups of vertical conductive structures are visually distinct from each other in the magnified image of the I/O regions. In the example of FIG. 11, the I/O region 352 has a first group 362 of ten vertical conductive structures and a second group 364 of ten vertical conductive structures (with the groups 362 and 364 of conductive structures being within dashed lines in FIG. 11). The first group 362 and the second group 364 of vertical conductive structures are adjacent and separated by relatively further spacing. In the example of FIG. 11, the column label is mapped to the fifth vertical conductive structure from the left in the second group 364 of vertical conductive structures, and this vertical conductive structure corresponding to the column label is highlighted on the GUI (graphical user interface) screen 310.

Referring to FIG. 6, the data processor 302 also maps the row label to a horizontal conductive structure corresponding to the row label on the third magnified image of the I/O region corresponding to the I/O label (step 424 of FIG. 6). Programming applications, such as the Authorware Professional Macromedia Program from Macromedia, Inc. located in San Francisco Calif., for mapping information to an area on a graphical image are known and commercially available to one of ordinary skill in the art of software programming. Such a programming application is used to program the mapping of the row label to a horizontal conductive structure corresponding to the row label on the third magnified image of the I/O region corresponding to the I/O label.

As described herein with reference to FIG. 4, an I/O region is comprised of a plurality of horizontal conductive structures with each horizontal conductive structure coupled to the control gate of a row of MOS (metal oxide semiconductor) type of memory cells. The row label corresponds to the horizontal conductive structure coupled to the row of memory cells having the failed memory cell.

Referring to FIG. 11, the data processor 302 displays the third magnified image of the I/O region corresponding to the I/O label on the GUI (graphical user interface) screen 310 with the horizontal conductive structure corresponding to the row label highlighted (step 426 of FIG. 6). In FIG. 11, for example, the row label is mapped to the fourth horizontal conductive structure from the top, and this horizontal conductive structure corresponding to the row label is highlighted on the GUI (graphical user interface) screen 310.

In this manner, the first magnified image of the memory IC die is generated with the sector corresponding to the sector label highlighted (as illustrated in FIG. 9 for example). In addition, the second magnified image of the sector corresponding to the sector label is generated with the I/O region corresponding to the I/O label highlighted (as illustrated in FIG. 10 for example). Furthermore, the third magnified image of the I/O region corresponding to the I/O label is generated with the vertical conductive structure corresponding to the column label and the horizontal conductive structure corresponding to the row label highlighted (as illustrated in FIG. 11 for example).

The computer system 300 automatically generates such magnified images from the label information of the failed memory cell of a memory IC die. In this manner, the physical location of the horizontal conductive structure and of the vertical conductive structure and of the failed memory cell on magnified images of the memory IC die is automatically determined and displayed on the GUI (graphical user interface) from the label information of the failed memory cell within a relatively short period of time (such as a fraction of a minute, for example). Thus, an operator is saved from the time-consuming labor of counting thousands of conductive structures of the prior art manual determination process. In addition, the present invention avoids the human error of the prior art manual determination process.

An operator then uses such images as an aid in determining the physical location of the structures of the failed memory cell on the memory IC die when the memory IC die is under a microscope of another testing system for further determining the cause of the failure of the failed memory cell. With determination of the cause of failure of the memory cell, corrective action may be undertaken to prevent the occurrence of failed memory cells during manufacture of memory IC dies.

The foregoing is by way of example only and is not intended to be limiting. For example, the present invention is described for example layouts of memory IC dies. However, the present invention may be used with various types of layouts for various memory IC dies, as would be apparent to one of ordinary skill in the art from the description herein.

In addition, the present invention may be used to generate any combination of the first magnified image of the memory IC die with the sector corresponding to the sector label highlighted, and/or the second magnified image of the sector corresponding to the sector label with the I/O region corresponding to the I/O label highlighted, and/or the third magnified image of the I/O region corresponding to the I/O label with the vertical conductive structure corresponding to the column label and/or the horizontal conductive structure corresponding to the row label highlighted.

Furthermore, as will be understood by those skilled in the art, the structures described herein may be made or used in the same way regardless of their position and orientation. Accordingly, it is to be understood that terms and phrases such as "left", "top", "column", and "row" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method for automatically determining and displaying a physical location of a failed cell of an array of memory cells on a memory IC (integrated circuit) die, the method including the steps of:

accepting, by a data processor, a memory IC (integrated circuit) die name corresponding to said memory IC die;

accepting, by said data processor, a sector label, wherein said memory IC die is comprised of a plurality of sectors, and wherein said failed cell is located within a sector corresponding to said sector label;

retrieving, by said data processor, a first magnified image of said memory IC die corresponding to said memory IC die name from a data storage unit; and mapping, by said data processor, said sector label to a sector corresponding to said sector label on said first magnified image of said memory IC die.

2. The method of claim 1, further including the step of:

displaying, by said data processor, said first magnified image of said memory IC die with said sector corresponding to said sector label highlighted, on a GUI (graphical user interface).

3. The method of claim 1, further including the steps of:

accepting, by said data processor, an I/O (input/output) label, wherein said sector corresponding to said sector label is comprised of a plurality of I/O (input/output) regions, and wherein said failed cell is located within an I/O region corresponding to said I/O label;

retrieving, by said data processor, a second magnified image of said sector corresponding to said sector label from said data storage unit;

mapping, by said data processor, said I/O label to an I/O region corresponding to said I/O label on said second magnified image of said sector corresponding to said sector label; and displaying, by said data processor, said second magnified image of said sector corresponding to said sector label with said I/O region corresponding to said I/O label highlighted, on a GUI (graphical user interface).

4. The method of claim 3, further including the steps of:

accepting, by said data processor, a column label, wherein said I/O region corresponding to said I/O label is comprised of a plurality of columns of memory cells, and wherein each column of memory cells has a vertical conductive structure coupled to a node of each of said plurality of memory cells in said column, and wherein said failed cell is located within a column of memory cells corresponding to said column label;

retrieving, by said data processor, a third magnified image of said I/O region corresponding to said I/O label from said data storage unit;

mapping, by said data processor, said column label to a vertical conductive structure corresponding to said column label on said third magnified image of said I/O region corresponding to said I/O label; and displaying, by said data processor, said third magnified image of said I/O region corresponding to said I/O label with said vertical conductive structure corresponding to said column label highlighted, on said GUI (graphical user interface).

5. The method of claim 4, wherein said memory IC die is a non-volatile flash memory device comprised of an array of floating gate MOS (metal oxide semiconductor) memory cells, and wherein said vertical conductive structure is a metal line that is coupled to a drain of each of a column of floating gate MOS memory cells.

6. The method of claim 3, further including the steps of:

accepting, by said data processor, a row label, wherein said I/O region corresponding to said I/O label is comprised of a plurality of rows of memory cells, and wherein each row of memory cells has a horizontal conductive structure coupled to a node of each of said plurality of memory cells in said row, and wherein said failed cell is located within a row of memory cells corresponding to said row label;

retrieving, by said data processor, a third magnified image of said I/O region corresponding to said I/O label from said data storage unit;

mapping, by said data processor, said row label to a horizontal conductive structure corresponding to said row label on said third magnified image of said I/O region corresponding to said I/O label; and displaying, by said data processor, said third magnified image of said I/O region corresponding to said I/O label with said horizontal conductive structure corresponding to said row label highlighted, on said GUI (graphical user interface).

7. The method of claim 6, wherein said memory IC die is a non-volatile flash memory device comprised of an array of floating gate MOS (metal oxide semiconductor) memory cells, and wherein said horizontal conductive structure is a polysilicon line that is coupled to a control gate of each of a row of floating gate MOS memory cells.

8. The method of claim 1, wherein said data processor provides a pull-down menu of a plurality of memory IC die names on said GUI (graphical user interface) such that said operator inputs said memory IC die name by selecting said memory IC die name from said pull-down menu on said GUI (graphical user interface).

9. A method for automatically determining and displaying a physical location of a failed cell of an array of memory cells on a memory IC (integrated circuit) die, the method including the steps of:

accepting, by a data processor, a memory IC (integrated circuit) die name corresponding to said memory IC die;

wherein said data processor provides a pull-down menu of a plurality of memory IC die names on a GUI (graphical user interface) such that said operator inputs said memory IC die name by selecting said memory IC die name from said pull-down menu on said GUI (graphical user interface);

accepting, by said data processor, a sector label, wherein said memory IC die is comprised of a plurality of sectors, and wherein said failed cell is located within a sector corresponding to said sector label;

retrieving, by said data processor, a first magnified image of said memory IC die corresponding to said memory IC die name from a data storage unit;

mapping, by said data processor, said sector label to a sector corresponding to said sector label on said first magnified image of said memory IC die;

displaying, by said data processor, said first magnified image of said memory IC die with said sector corresponding to said sector label highlighted, on said GUI (graphical user interface);

accepting, by said data processor, an I/O (input/output) label, wherein said sector corresponding to said sector label is comprised of a plurality of I/O (input/output) regions, and wherein said failed cell is located within an I/O region corresponding to said I/O label;

retrieving, by said data processor, a second magnified image of said sector corresponding to said sector label from said data storage unit;

mapping, by said data processor, said I/O label to an I/O region corresponding to said I/O label on said second magnified image of said sector corresponding to said sector label;

displaying, by said data processor, said second magnified image of said sector corresponding to said sector label with said I/O region corresponding to said I/O label highlighted, on said GUI (graphical user interface);

accepting, by said data processor, a column label, wherein said I/O region corresponding to said I/O label is comprised of a plurality of columns of memory cells, and wherein each column of memory cells has a vertical conductive structure coupled to a first type of node of each of said plurality of memory cells in said column, and wherein said failed cell is located within a column of memory cells corresponding to said column label;

retrieving, by said data processor, a third magnified image of said I/O region corresponding to said I/O label from said data storage unit;

mapping, by said data processor, said column label to a vertical conductive structure corresponding to said column label on said third magnified image of said I/O region corresponding to said I/O label;

displaying, by said data processor, said third magnified image of said I/O region corresponding to said I/O label with said vertical conductive structure corresponding to said column label highlighted, on said GUI (graphical user interface);

accepting, by said data processor, a row label, wherein said I/O region corresponding to said I/O label is comprised of a plurality of rows of memory cells, and wherein each row of memory cells has a horizontal conductive structure coupled to a second type of node of each of said plurality of memory cells in said row, and wherein said failed cell is located within a row of memory cells corresponding to said row label;

retrieving, by said data processor, said third magnified image of said I/O region corresponding to said I/O label from said data storage unit;

mapping, by said data processor, said row label to a horizontal conductive structure corresponding to said row label on said third magnified image of said I/O region corresponding to said I/O label; and displaying, by said data processor, said third magnified image of said I/O region corresponding to said I/O label with said horizontal conductive structure corresponding to said row label highlighted, on said GUI (graphical user interface);

wherein said memory IC die is a non-volatile flash memory device comprised of an array of floating gate MOS (metal oxide semiconductor) memory cells, and wherein said vertical conductive structure is a metal line that is coupled to a drain of each of a column of floating gate MOS memory cells, and wherein said horizontal conductive structure is a polysilicon line that is coupled to a control gate of each of a row of floating gate MOS memory cells.

10. A computer system comprising:

a processor; and a data storage unit having stored therein a respective set of plurality of images corresponding to each of a plurality of memory IC (integrated circuit) die names;

and wherein said data storage unit has sequences of instructions stored thereon, and wherein execution of said sequences of instructions by said processor causes said processor to automatically determine and display a physical location of a failed cell of an array of memory cells on a memory IC (integrated circuit) die by performing the steps of:

accepting a memory IC (integrated circuit) die name corresponding to said memory IC die having said failed memory cell;

accepting a sector label, wherein said memory IC die is comprised of a plurality of sectors, and wherein said failed cell is located within a sector corresponding to said sector label;

retrieving a first magnified image of said memory IC die corresponding to said memory IC die name from said data storage unit; and mapping said sector label to a sector corresponding to said sector label on said first magnified image of said memory IC die.

11. The computer system of claim 10, wherein said data processor further performs the step of:
   displaying said first magnified image of said memory IC die with said sector corresponding to said sector label highlighted, on a GUI (graphical user interface) of said computer system.

12. The computer system of claim 10, wherein said data processor further performs the steps of:
   accepting an I/O (input/output) label, wherein said sector corresponding to said sector label is comprised of a plurality of I/O (input/output) regions, and wherein said failed cell is located within an I/O region corresponding to said I/O label;
   retrieving a second magnified image of said sector corresponding to said sector label from said data storage unit;
   mapping said I/O label to an I/O region corresponding to said I/O label on said second magnified image of said sector corresponding to said sector label; and
   displaying said second magnified image of said sector corresponding to said sector label with said I/O region corresponding to said I/O label highlighted on a GUI (graphical user interface).

13. The computer system of claim 12, wherein said data processor further performs the steps of:
   accepting a column label, wherein said I/O region corresponding to said I/O label is comprised of a plurality of columns of memory cells,
   and wherein each column of memory cells has a vertical conductive structure coupled to a node of each of said plurality of memory cells in said column, and wherein said failed cell is located within a column of memory cells corresponding to said column label;
   retrieving a third magnified image of said I/O region corresponding to said I/O label from said data storage unit;
   mapping said column label to a vertical conductive structure corresponding to said column label on said third magnified image of said I/O region corresponding to said I/O label; and
   displaying said third magnified image of said I/O region corresponding to said I/O label with said vertical conductive structure corresponding to said column label highlighted, on said GUI (graphical user interface).

14. The computer system of claim 13, wherein said memory IC die is a non-volatile flash memory device comprised of an array of floating gate MOS (metal oxide semiconductor) memory cells, and wherein said vertical conductive structure is a metal line that is coupled to a drain of each of a column of floating gate MOS memory cells.

15. The computer system of claim 12, wherein said data processor further performs the steps of:
   accepting a row label, wherein said I/O region corresponding to said I/O label is comprised of a plurality of rows of memory cells,
   and wherein each row of memory cells has a horizontal conductive structure coupled to a node of each of said plurality of memory cells in said row, and wherein said failed cell is located within a row of memory cells corresponding to said row label;
   retrieving a third magnified image of said I/O region corresponding to said I/O label from said data storage unit;
   mapping said row label to a horizontal conductive structure corresponding to said row label on said third magnified image of said I/O region corresponding to said I/O label; and
   displaying said third magnified image of said I/O region corresponding to said I/O label with said horizontal conductive structure corresponding to said row label highlighted, on said GUI (graphical user interface).

16. The computer system of claim 15, wherein said memory IC die is a non-volatile flash memory device comprised of an array of floating gate MOS (metal oxide semiconductor) memory cells, and wherein said horizontal conductive structure is a polysilicon line that is coupled to a control gate of each of a row of floating gate MOS memory cells.

17. The computer system of claim 10, wherein said data processor further performs the step of:
   providing a pull-down menu of a plurality of memory IC die names on said GUI (graphical user interface) such that said operator inputs said memory IC die name by selecting said memory IC die name from said pull-down menu on said GUI (graphical user interface).

18. A computer system comprising:
   a processor; and
   a data storage unit having stored therein a respective set of plurality of images corresponding to each of a plurality of memory IC (integrated circuit) die names;
   and wherein said data storage unit has sequences of instructions stored thereon, and wherein execution of said sequences of instructions by said processor causes said processor to automatically determine and display a physical location of a failed cell of an array of memory cells on a memory IC (integrated circuit) die by performing the steps of:
     providing a pull-down menu of a plurality of memory IC die names on a GUI (graphical user interface) such that an operator inputs a memory IC die name by selecting said memory IC die name from said pull-down menu on a GUI (graphical user interface);
     accepting said memory IC (integrated circuit) die name corresponding to said memory IC die having said failed memory cell;
     accepting a sector label, wherein said memory IC die is comprised of a plurality of sectors, and wherein said failed cell is located within a sector corresponding to said sector label;
     retrieving a first magnified image of said memory IC die corresponding to said memory IC die name from said data storage unit;
     mapping said sector label to a sector corresponding to said sector label on said first magnified image of said memory IC die;
     displaying said first magnified image of said memory IC die with said sector corresponding to said sector label highlighted, on said GUI (graphical user interface) of said computer system;
     accepting an I/O (input/output) label, wherein said sector corresponding to said sector label is comprised of a plurality of I/O (input/output) regions, and wherein said failed cell is located within an I/O region corresponding to said I/O label;
     retrieving a second magnified image of said sector corresponding to said sector label from said data storage unit;
     mapping said I/O label to an I/O region corresponding to said I/O label on said second magnified image of said sector corresponding to said sector label;
     displaying said second magnified image of said sector corresponding to said sector label with said I/O region corresponding to said I/O label highlighted, on said GUI (graphical user interface);

accepting a column label, wherein said I/O region corresponding to said I/O label is comprised of a plurality of columns of memory cells, and wherein each column of memory cells has a vertical conductive structure coupled to a first type of node of each of said plurality of memory cells in said column, and wherein said failed cell is located within a column of memory cells corresponding to said column label;

retrieving a third magnified image of said I/O region corresponding to said I/O label from said data storage unit;

mapping said column label to a vertical conductive structure corresponding to said column label on said third magnified image of said I/O region corresponding to said I/O label;

displaying said third magnified image of said I/O region corresponding to said I/O label with said vertical conductive structure corresponding to said column label highlighted, on said GUI (graphical user interface);

accepting a row label, wherein said I/O region corresponding to said I/O label is comprised of a plurality of rows of memory cells, and wherein each row of memory cells has a horizontal conductive structure coupled to a second type of node of each of said plurality of memory cells in said row, and wherein said failed cell is located within a row of memory cells corresponding to said row label;

retrieving said third magnified image of said I/O region corresponding to said I/O label from said data storage unit;

mapping said row label to a horizontal conductive structure corresponding to said row label on said third magnified image of said I/O region corresponding to said I/O label; and displaying said third magnified image of said I/O region corresponding to said I/O label with said horizontal conductive structure corresponding to said row label highlighted, on said GUI (graphical user interface);

wherein said memory IC die is a non-volatile flash memory device comprised of an array of floating gate MOS (metal oxide semiconductor) memory cells, and wherein said vertical conductive structure is a metal line that is coupled to a drain of each of a column of floating gate MOS memory cells, and wherein said horizontal conductive structure is a polysilicon line that is coupled to a control gate of each of a row of floating gate MOS memory cells.

19. A computer readable medium having stored thereon sequences of instructions for automatically determining and displaying a physical location of a failed cell of an array of memory cells on a memory IC (integrated circuit) die, wherein the sequences of instructions are for performing the steps of:

accepting, by a data processor, a memory IC (integrated circuit) die name corresponding to said IC memory device;

accepting, by said data processor, a sector label, wherein said memory IC die is comprised of a plurality of sectors, and wherein said failed cell is located within a sector corresponding to said sector label;

retrieving, by said data processor, a first magnified image of said memory IC die corresponding to said memory IC die name from a data storage unit; and mapping, by said data processor, said sector label to a sector corresponding to said sector label on said first magnified image of said memory IC die.

20. The computer readable medium of claim 19, further comprising sequences of instructions for performing the step of:

displaying, by said data processor, said first magnified image of said memory IC die with said sector corresponding to said sector label highlighted, on a GUI (graphical user interface).

21. The computer readable medium of claim 19, further comprising sequences of instructions for performing the steps of:

accepting, by said data processor, an I/O (input/output) label, wherein said sector corresponding to said sector label is comprised of a plurality of I/O (input/output) regions, and wherein said failed cell is located within an I/O region corresponding to said I/O label;

retrieving, by said data processor, a second magnified image of said sector corresponding to said sector label from said data storage unit;

mapping, by said data processor, said I/O label to an I/O region corresponding to said I/O label on said second magnified image of said sector corresponding to said sector label; and displaying, by said data processor, said second magnified image of said sector corresponding to said sector label with said I/O region corresponding to said I/O label highlighted, on a GUI (graphical user interface).

22. The computer readable medium of claim 21, further comprising sequences of instructions for performing the steps of:

accepting, by said data processor, a column label, wherein said I/O region corresponding to said I/O label is comprised of a plurality of columns of memory cells, and wherein each column of memory cells has a vertical conductive structure coupled to a node of each of said plurality of memory cells in said column, and wherein said failed cell is located within a column of memory cells corresponding to said column label;

retrieving, by said data processor, a third magnified image of said I/O region corresponding to said I/O label from said data storage unit;

mapping, by said data processor, said column label to a vertical conductive structure corresponding to said column label on said third magnified image of said I/O region corresponding to said I/O label; and displaying, by said data processor, said third magnified image of said I/O region corresponding to said I/O label with said vertical conductive structure corresponding to said column label highlighted, on said GUI (graphical user interface).

23. The computer readable medium of claim 22, wherein said memory IC die is a non-volatile flash memory device comprised of an array of floating gate MOS (metal oxide semiconductor) memory cells, and wherein said vertical conductive structure is a metal line that is coupled to a drain of each of a column of floating gate MOS memory cells.

24. The computer readable medium of claim 21, further comprising sequences of instructions for performing the steps of:

accepting, by said data processor, a row label, wherein said I/O region corresponding to said I/O label is comprised of a plurality of rows of memory cells, and wherein each row of memory cells has a horizontal conductive structure coupled to a node of each of said plurality of memory cells in said row, and wherein said failed cell is located within a row of memory cells corresponding to said row label;

retrieving, by said data processor, a third magnified image of said I/O region corresponding to said I/O label from said data storage unit;

mapping, by said data processor, said row label to a horizontal conductive structure corresponding to said row label on said third magnified image of said I/O region corresponding to said I/O label; and displaying, by said data processor, said third magnified image of said I/O region corresponding to said I/O label with said horizontal conductive structure corresponding to said row label highlighted, on said GUI (graphical user interface).

25. The computer readable medium of claim 24, wherein said memory IC die is a non-volatile flash memory device comprised of an array of floating gate MOS (metal oxide semiconductor) memory cells, and wherein said horizontal conductive structure is a polysilicon line that is coupled to a control gate of each of a row of floating gate MOS memory cells.

26. The computer readable medium of claim 19, further comprising sequences of instructions for performing the step of:

providing a pull-down menu of a plurality of memory IC die names on said GUI (graphical user interface) such that said operator inputs said memory IC die name by selecting said memory IC die name from said pull-down menu on said GUI (graphical user interface).

27. A computer readable medium having stored thereon sequences of instructions for automatically determining and displaying a physical location of a failed cell of an array of memory cells on a memory IC (integrated circuit) die, wherein the sequences of instructions are for performing the steps of:

providing a pull-down menu of a plurality of memory IC die names on a GUI (graphical user interface) such that an operator inputs a memory IC die name by selecting said memory IC die name from said pull-down menu on a GUI (graphical user interface);

accepting, by a data processor, said memory IC (integrated circuit) die name corresponding to said memory IC device;

accepting, by said data processor, a sector label, wherein said memory IC die is comprised of a plurality of sectors, and wherein said failed cell is located within a sector corresponding to said sector label;

retrieving, by said data processor, a first magnified image of said memory IC die corresponding to said memory IC die name from a data storage unit;

mapping, by said data processor, said sector label to a sector corresponding to said sector label on said first magnified image of said memory IC die;

displaying, by said data processor, said first magnified image of said memory IC die with said sector corresponding to said sector label highlighted, on said GUI (graphical user interface);

accepting, by said data processor, an I/O (input/output) label, wherein said sector corresponding to said sector label is comprised of a plurality of I/O (input/output) regions, and wherein said failed cell is located within an I/O region corresponding to said I/O label;

retrieving, by said data processor, a second magnified image of said sector corresponding to said sector label from said data storage unit;

mapping, by said data processor, said I/O label to an I/O region corresponding to said I/O label on said second magnified image of said sector corresponding to said sector label;

displaying, by said data processor, said second magnified image of said sector corresponding to said sector label with said I/O region corresponding to said I/O label highlighted, on said GUI (graphical user interface);

accepting, by said data processor, a column label, wherein said I/O region corresponding to said I/O label is comprised of a plurality of columns of memory cells, and wherein each column of memory cells has a vertical conductive structure coupled to a first type of node of each of said plurality of memory cells in said column, and wherein said failed cell is located within a column of memory cells corresponding to said column label;

retrieving, by said data processor, a third magnified image of said I/O region corresponding to said I/O label from said data storage unit;

mapping, by said data processor, said column label to a vertical conductive structure corresponding to said column label on said third magnified image of said I/O region corresponding to said I/O label;

displaying, by said data processor, said third magnified image of said I/O region corresponding to said I/O label with said vertical conductive structure corresponding to said column label highlighted, on said GUI (graphical user interface);

accepting, by said data processor, a row label, wherein said I/O region corresponding to said I/O label is comprised of a plurality of rows of memory cells, and wherein each row of memory cells has a horizontal conductive structure coupled to a second type of node of each of said plurality of memory cells in said row, and wherein said failed cell is located within a row of memory cells corresponding to said row label;

retrieving, by said data processor, said third magnified image of said I/O region corresponding to said I/O label from said data storage unit;

mapping, by said data processor, said row label to a horizontal conductive structure corresponding to said row label on said third magnified image of said I/O region corresponding to said I/O label; and displaying, by said data processor, said third magnified image of said I/O region corresponding to said I/O label with said horizontal conductive structure corresponding to said row label highlighted, on said GUI (graphical user interface);

wherein said memory IC die is a non-volatile flash memory device comprised of an array of floating gate MOS (metal oxide semiconductor) memory cells, and wherein said vertical conductive structure is a metal line that is coupled to a drain of each of a column of floating gate MOS memory cells, and wherein said horizontal conductive structure is a polysilicon line that is coupled to a control gate of each of a row of floating gate MOS memory cells.

* * * * *